Figure 1:
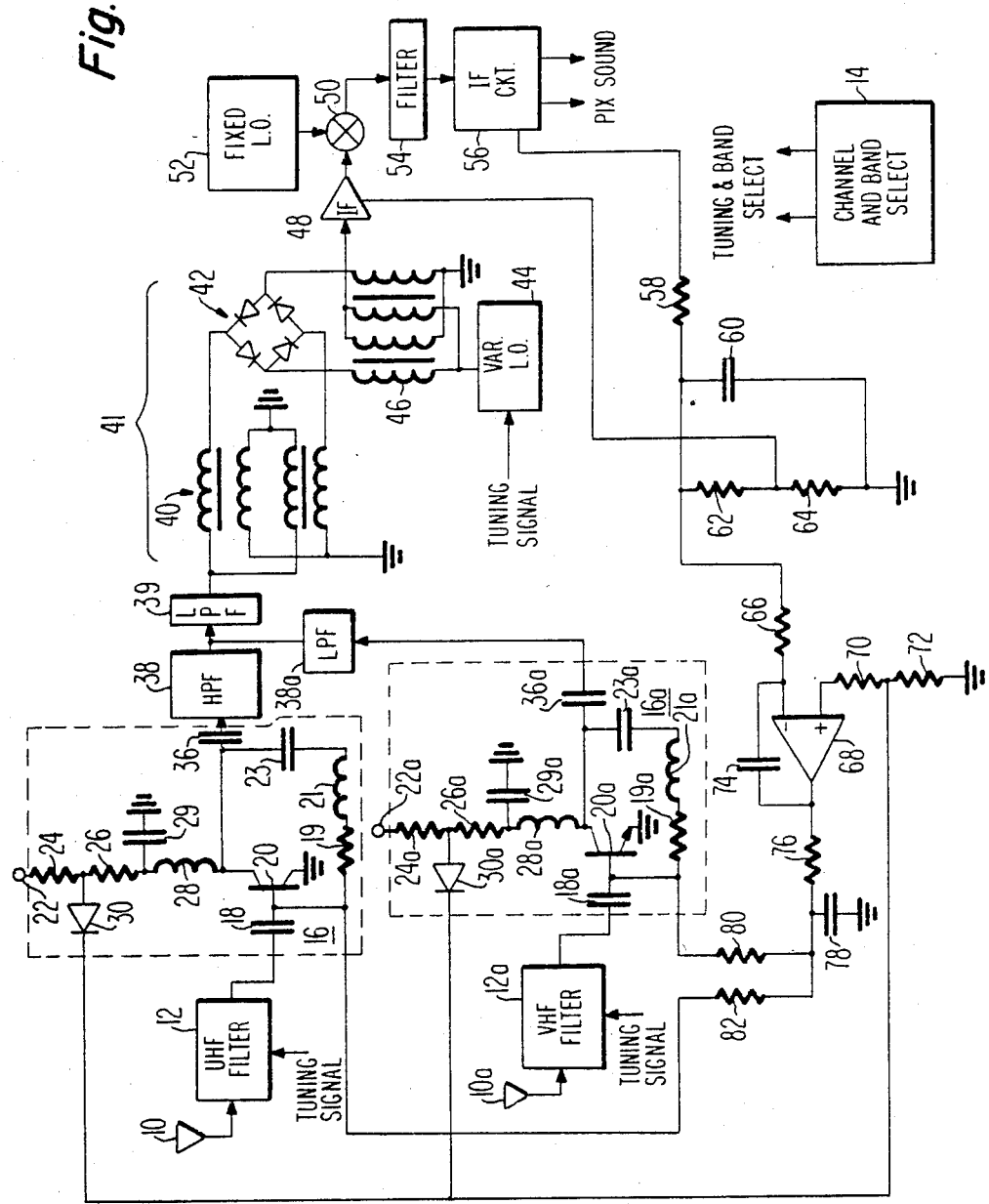

United States Patent [19]

Muterspaugh

[11] Patent Number: 4,558,289
[45] Date of Patent: Dec. 10, 1985

[54] BIAS AND AGC CONTROL OF TWO RF AMPLIFIERS WITH A SHARED CONTROL ELEMENT

[75] Inventor: Max W. Muterspaugh, Indianapolis, Ind.

[73] Assignee: RCA Corporation, Princeton, N.J.

[21] Appl. No.: 564,913

[22] Filed: Dec. 23, 1983

[51] Int. Cl.[4] ............................................. H03G 3/18
[52] U.S. Cl. .................................. 330/278; 330/126; 330/295
[58] Field of Search ...................... 330/51, 124 R, 125, 330/126, 278, 279, 295, 282; 358/174

[56] References Cited

U.S. PATENT DOCUMENTS

| 3,493,882 | 2/1970 | Seader et al. |
| 3,688,198 | 8/1972 | George ........................... 358/174 X |
| 3,693,091 | 9/1972 | Russell ................................ 358/174 |
| 3,693,092 | 9/1972 | Russell . |
| 3,823,379 | 7/1974 | George . |

FOREIGN PATENT DOCUMENTS 2114391A 1/1982 United Kingdom .
2088659 6/1982 United Kingdom ................ 358/174

Primary Examiner—James B. Mullins
Assistant Examiner—Steven J. Mottola
Attorney, Agent, or Firm—Paul J. Rasmussen; Peter M. Emanuel; Adel A. Ahmed

[57] ABSTRACT

A plurality of common emitter transistor amplifiers have the output of a single operational amplifier applying an AGC signal to their bases. An input of the operational amplifier is connected to the collectors through respective diodes to isolate and to selectively form a feedback loop for the on amplifier from the off amplifier. Another input of the operational amplifier receives the AGC voltage so that the operational amplifier varies the base current and hence the gain of the common emitter transistor which is on.

8 Claims, 2 Drawing Figures

BIAS AND AGC CONTROL OF TWO RF AMPLIFIERS WITH A SHARED CONTROL ELEMENT

The present invention relates to a circuit for applying an AGC (automatic gain control) signal to two RF (radio frequency) amplifying stages.

In U.S. patent application entitled "Bipolar AGC With RF Transistor DC Bias Point Stabilization", filed concurrently herewith in the name of G. F. Tannery IV, and under common assignment herewith, Ser. No. 564,911, there is disclosed a circuit for applying an AGC (automatic gain control) voltage to an RF amplifier stage of a double conversion television tuner. The stage comprises a bipolar transistor in grounded emitter amplifier mode. This transistor type and mode are used to minimize the emitter lead inductance to ground so that stable RF operation is obtained and to properly drive filters and a DBM (doubly balanced mixer) that follow the RF stage. To AGC this stage, the collector-emitter path of a second control transistor is coupled between the collector and base of the RF amplifying transistor and receives an AGC signal at its base so as to provide base current to the RF transistor in accordance with the AGC voltage. The varying base current varies the gain of the RF stage. As shown in said Tannery application, two RF amplifying stages are present as in a typical television tuner, one for VHF, the other for UHF. Thus, two control transistors are required to AGC both stages. Further, as also shown in the above said Tannery application, a transistor in the emitter follower configuration is required to properly drive the low impedance bases of the two control transistors from the high impedance source of AGC voltage. Thus, a total of three transistors is required to achieve AGC of the RF stages. This is expensive.

In accordance with an aspect of the present invention, a plurality of selectively operable amplifying stages such as the RF stages of a tuner for different frequency ranges, share a common feedback varying control element such as an operational amplifier which is responsive to an AGC signal. Selection means selectively couples the common control element to the operative amplifier.

Figure 2:
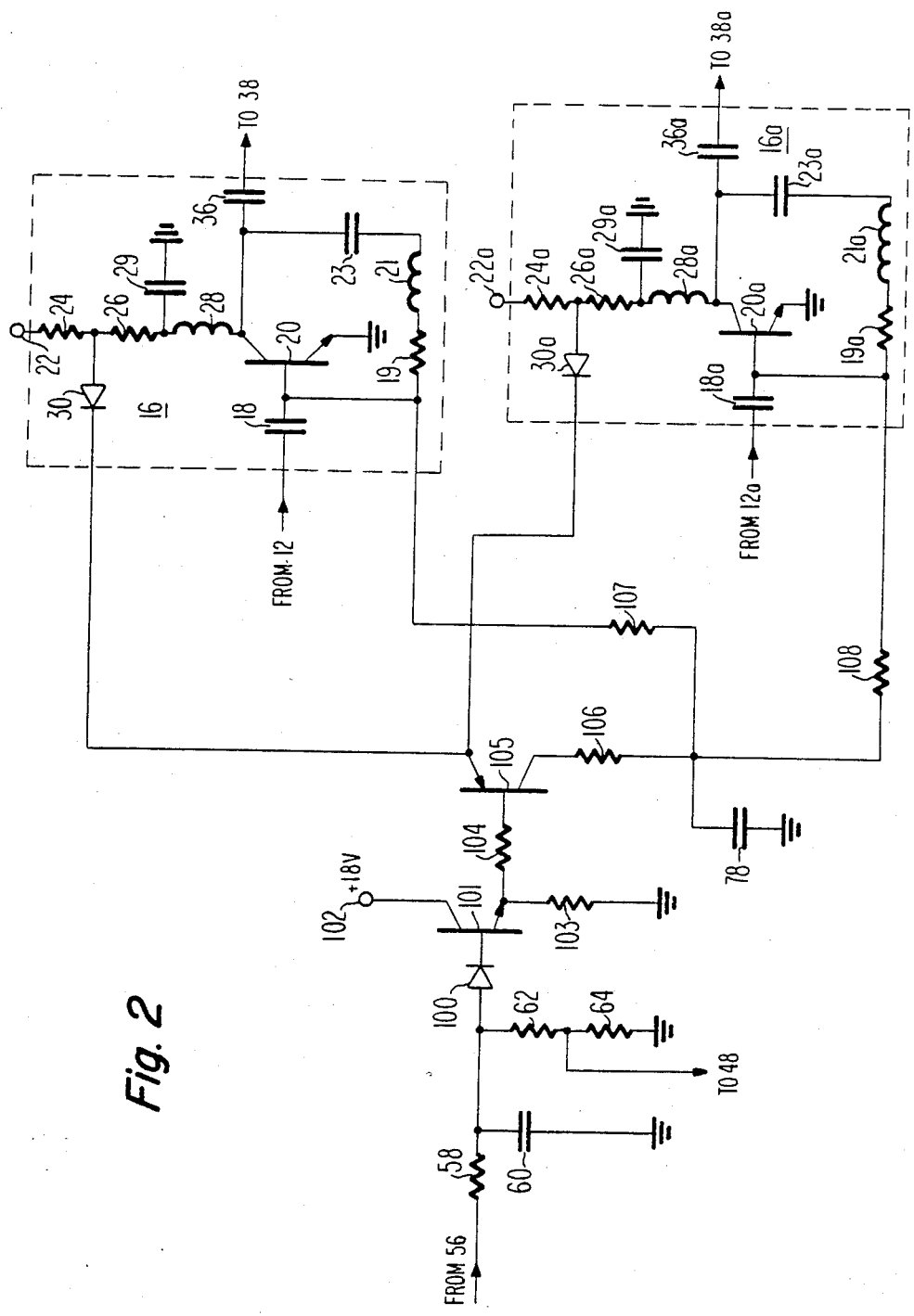

These and other aspects of the invention will be described with reference to the accompanying Drawing including:

FIG. 1 is a partly schematic and partly block diagram of a double conversion tuner incorporating the preferred embodiment of the invention; and FIG. 2 is a schematic diagram of an alternate embodiment of the invention.

In FIG. 1, a UHF antenna 10 receives UHF television signals which are applied to tunable UHF filter 12, which filter receives tuning and bandswitching signals from channel and band select unit 14, e.g., as shown in U.S. Pat. No. 4,408,348. The signal from filter 12 is applied to RF amplifying stage 16. In particular, the UHF signal is applied through DC blocking capacitor 18 to the base of grounded emitter NPN transistor 20. When a UHF channel is selected, a bandswitching voltage, e.g., 18 volts, is coupled from channel and band select unit 14 to supply terminal 22, which is coupled to the collector of transistor 20 through series coupled resistors 24 and 26 and RF choke coil 28. A capacitor 29 bypasses to ground the junction of coil 28 and resistor 26. A diode 30 has its anode connected to the junction of resistors 24 and 26 and its cathode connected to the non-inverting input of operational amplifier 68. Amplifier 68 provides base current to transistor 20 in accordance with an AGC signal applied to its inverting input as is explained in detail below. Negative RF feedback is provided by resistor 19, inductance 21 and DC blocking capacitor 23. The feedback is designed to provide essentially 50 ohms input and output impedance for stage 16 and essentially constant gain over the UHF television band. The amplified RF signal at the collector of transistor 20 is applied through DC blocking capacitor 36 to HPF (high pass filter) 38 having a cutoff frequency of about 440 MHz and 50 ohms input and output impedances.

As in the UHF signal path, a source of VHF signals shown, e.g., as a VHF antenna 10a, applies VHF signals to tunable VHF filter 12a, which receives tuning and bandswitching signals from unit 14. The output signal from filter 12a is applied to RF amplifier 16a, which is of identical construction, except for some component values, to that of amplifier 16. Components of amplifier 16a that correspond to components of amplifier 16 have been given the same reference numerals with the suffix "a". VHF amplifier 16a is coupled to operational amplifier 68 in the same manner as UHF amplifier 16 to be AGC'd thereby. The output signal from amplifier 16a is applied to LPF (low pass filter) 38a having a cutoff frequency of about 420 MHz and input and output impedances of 50 ohms.

The outputs of filters 38 and 38a are coupled together and to the input of LPF 39 having a cutoff frequency to about 890 MHz, which forms a bandpass filter with HPF 38 for UHF signals. The output signal from LPF 39 is applied to 1:4 impedance transforming balun 40 of a DBM (doubly balanced mixer) 41.

As explained in said application, amplifiers 16 and 16a have bipolar transistors 20 and 20a due to the low input impedance and current drive requirements of DBM 41 and therefore LPF 39, HPF 38 and LPF 38a. The low input impedance of DBM 41 is a result of the use of a diode bridge and its load impedance, which is made low to minimize spurious signal generation. The common emitter configuration is used to achieve a sufficiently high gain when negative feedback is used to achieve the low output impedance of stages 16 and 16a.

When a channel in the UHF band is selected, amplifier 16 is caused to be on by the application of supply voltage to terminal 22 and amplifier 16a is caused to be off by the application of ground potential to terminal 22a. The reverse is true when a VHF channel is selected. Filters 38 and 38a serve to further isolate the selected one of the UHF and VHF signal paths (as determined by unit 14) from the non-selected path, as is explained in greater detail in U.S. Pat. No. 4,397,037. In addition, diode 30 of amplifier 16 or corresponding diode 30a of amplifier 16a are reversed biased when the respective one of amplifiers 16 and 16a is caused to be off by the application of ground potential to the respective one of terminals 22 and 22a and since the cathodes are grounded through resistor 72. Thus, operational amplifier 68 is selectively coupled in a DC feedback path, which path is variable in response to the AGC signal, between the collectors and bases of transistors 20 and 20a, respectively, depending on whether the selected channel is in the UHF or VHF ranges.

In DBM 41, the balanced output signals to balun 40 are applied a diode bridge 42. Also applied to diode bridge 42 are the balanced output signals of a 1:4 balun 46 which receives at its unbalanced input the output signal from variable local oscillator (LO) 44. Oscillator 44 has its frequency controlled in response to a tuning voltage produced by unit 14 which may, for that purpose, include a phase locked loop. The frequency of LO 44 has a range of 668 to 1498 MHz. IF (intermediate frequency) amplifier 48 is coupled to an output of DBM 41 taken from balun 46 and is tuned to have a bandpass characteristic from 608 to 614 MHz (which corresponds to UHF channel 37) and thus selects and amplifies the difference frequency output signal from DBM 41. Amplifier 48 also receives an AGC signal.

The reason for using channel 37, which is not used for TV broadcast, for the frequency range of the first IF signal is explained in U.S. patent application Ser. No. 508,595 filed in the name of G. C. Hermeling, et al. Also, as explained in detail in said Hermeling application, a DBM is used as mixer 41 since it rejects direct feedthrough signals such as the RF signals for channels 36 and 38.

A MOSFET arranged as shown in the aforesaid Tannery application is preferred for amplifier 48 since the AGC gate has a high impedance and therefore does not require an emitter follower to drive it. Also the high input and output impedances of a MOSFET do not detune input and output filters (not shown) associated with amplifier 48 with changes in AGC voltage. Still further, a MOSFET is used since its second gate versus voltage characteristic has a plateau region by which AGC delay is provided (i.e., only a small gain reduction of stage 48 takes place as RF signal strength initially increases). As a result, RF stages 16 and 16a are first reduced in gain as the RF signal strength increases. This improves the signal to noise performance of the tuner The output signal from amplifier 48 is applied to mixer 50. Also applied to mixer 50 is a 567 MHz signal from fixed frequency local oscillator 52. The output signal of mixer 50 is applied to filter 54, which can be of the SAW (surface acoustic wave) type. Filter 54 is tuned to the conventional 41-47 MHz television IF range, and thus it selects the difference frequency output signal from mixer 50. This signal is amplified and then detected in IF circuit 56 to provide a composite color signal and a 4.5 MHz intercarrier sound signal. Also provided by IF circuit 56 is an AGC signal having a range of 12 volts (maximum gain) to zero volts (minimum gain). Circuit 56 can be a type TA7607 integrated circuit manufactured by Toshiba Corporation.

The AGC voltage from circuit 56 is applied to series resistor 58 which prevents surges of the AGC voltage due, e.g., to an arc-over in the kinescope (not shown). Shunt capacitor 60, in conjunction with resistor 58 and the source resistance (e.g., 39,000 ohms) of the AGC voltage source in circuit 56, forms a low pass filter having a time constant selected so that the AGC circuit is stable and does not respond to short term perterbations of the received RF signal such as airplane flutter. The voltage across capacitor 60 is applied to a voltage divider comprising resistors 62 and 64. The junction of resistors 62 and 64 provides an AGC voltage to the high impedance second gate 84 of MOSFET amplifier 48. The values of resistors 62 and 64 are selected so that when the AGC voltage developed by IF circuit 56 is at its maximum of 12 volts, 8 volts are applied to the second gate of MOSFET amplifier 48. The 8 volt maximum at the junction of resistors 62 and 64 is suitable for the biasing of MOSFET amplifier 48 in its plateau region to provide AGC delay as will be explained below.

The AGC voltage is also applied through resistor 66 to the inverting input of operational amplifier 68. Capacitor 74 is coupled between the output and inverting input of amplifier 68. Capacitor 74 and resistor 66, in conjunction with amplifier 68, form a low pass filter with a cutoff frequency of about 8 kHz which prevents parasitic oscillations by amplifier 68 which might otherwise occur at about 100 kHz. The output signal from amplifier 68 is applied through resistor 76 to RF bypass capacitor 78, which prevents the UHF and VHF signals from being applied to the VHF stage 16a and UHF stage 16, respectively. Resistor 76 helps isolate amplifier 68 from capacitor 78, which further helps prevent parasitic oscillations. The AGC signal from amplifier 68 is applied through resistors 80 and 82 to the bases of transistors 20a and 20, respectively. Resistors 76, 80, and 82, act as current limiting resistors to prevent damage to transistors 20 and 20a and amplifier 68 from excessive current. Diodes 30 and 30a have anodes coupled to the junction of resistors 24 and 26 and 24a and 26a respectively, and cathodes coupled together and to the junction of resistors 70 and 72. The remaining end of resistor 72 is grounded. The remaining end of resistor 70 is connected to the non-inverting input of amplifier 68. Resistor 72 allows whichever of diodes 30 or 30a has its anode connected to the positive bandswitching voltage at terminal 22 or 22a respectively, to draw current and thus be in the conductive state. Resistor 70, if equal in value to resistor 66, balances out the offset in the output voltage of amplifier 68 due to the bias current drawn by both inputs of amplifier 68. As earlier noted, if a UHF channel is selected, diode 30 is rendered conductive and a DC feedback path is created between the collector circuit of transistor 20 at the junction of resistors 24 and 26 and the base of transistor 20 including, in the order named, diode 30, resistor 70, amplifier 68, resistor 76 and resistor 82. Due to the phase inversion of transistor 20, this path comprises a negative feedback path. When a VHF channel is selected, diode 30a is rendered conductive and a similar DC feedback circuit is created between the collector circuit of transistor 20a and the base of transistor 20a. That feedback circuit includes diodes 30a and resistor 80 instead of diode 30 and resistor 82.

To explain the AGC operation of the circuit, assume that a UHF channel has been selected and that a weak UHF RF signal is being received. At this point, the AGC voltage from circuit 56 is 12 volts. This voltage is applied through resistors 58 and 66 to the inverting input of amplifier 68. The voltage at the junction of resistors 24 and 26 is applied through diode 30 and resistor 70 to the non-inverting input of amplifier 68. The difference between the input voltages of amplifier 68 is amplified and applied through resistors 76 and 82 to the base of transistor 20. This causes transistor 20 to conduct current, thereby dropping the voltage at the junction of resistors 24 and 26. Thus, the voltage at the non-inverting input drops until it equals the voltage at the inverting input, e.g., 12 volts. The value of resistors 24 and 26 are selected so that amplifier 68 is providing current to the base of transistor 20 so that amplifier 16 is at the maximum of the gain versus emitter current of transistor 20 characteristic curve when the AGC voltage is at its maximum of 12 volts. Also, at this point, amplifier 48 is providing maximum gain since it is receiving 8 volts of AGC voltage.

As the received RF signal strength increases, the AGC voltage, and hence the voltage at the inverting input of amplifier 68, goes lower. Thus, a difference exists between the input voltages of amplifier 68. This causes amplifier 68 to supply increased current to the base of transistor 20. Thus, more emitter and collector current is drawn by transistor 20 causing the voltage at the junction of resistors 24 and 26 to decrease. This continues until the voltages at the inputs of amplifier 68 are again equal. The effect of the increased collector current of transistor 20 is that the gain of amplifier 16 is decreased. The reduction of gain of amplifier 16 with increased signal strength protects amplifier 16 and DBM 41 from overloading and generating spurious signals. As noted before, because of the plateau region of the gain versus second gate voltage, the gain of amplifier 48 is initially only slightly decreased from its maximum at this point, thereby ensuring maximum signal to noise performance of amplifier 48.

As the received RF signal strength increases still further, causing the AGC voltage to decrease still further, transistor 20 becomes saturated and its gain drops below unity, i.e., it provides attenuation. When transistor 20 is saturated, the voltage at the junction of resistors 24 and 26 will be at some value, e.g., 9 volts. As the RF signal strength still further increases, the AGC voltage drops still further, but the voltage at the junction of resistors 24 and 26 cannot go any lower, since transistor 20 is already saturated. Resistors 76 and 82 prevent amplifier 68 from supplying a large current due to the large voltage difference at its inputs, thereby protecting both amplifier 68 and transistor 20. Similarly, resistors 76 and 80 protect transistor 20a from drawing excessive base current under these conditions. As the AGC voltage goes still lower, a gain reduction takes place in amplifier 48, thus continuing the AGC action that can no longer be performed by RF stage 16, since transistor 20 is already saturated. Near zero AGC volts, the largest reduction in gain of amplifier 48 takes place.

A feature of the invention will be appreciated by considering what happens if the base leakage current of transistor 20 increases, e.g., due to a temperature increase. Then the collector current increases, thereby lowering the voltage at the junction of resistors 24 and 26. This causes amplifier 68 to provide less base current to transistor 20. If the leakage current decreases, the opposite effect takes place. Thus, amplifier 68 provides negative DC feedback for transistor 20 to stabilize its bias point and gain which is determined by the AGC voltage at the inverting input of amplifier 68 and is relatively stable with changes in temperature. Similarly, if the bias current changes with changes in the base-emitter contact potential, the change will be compensated for by the negative feedback.

The following table provides typical values for some elements:

| Element | Value |
| --- | --- |
| resistors 24 and 26 | 300 ohms |
| resistor 62 | 1 Meg ohms |
| resistor 64 | 2 Meg ohms |
| resistor 58 | 1K ohms |
| capacitor 60 | 4.7 $\mu f$ |
| resistors 66, 70, 72 | 22K ohms |
| capacitors 18, 29, 36, 23, 74, 78 | 1000 pf |
| resistor 19 | 470 ohms |
| coil 21 | 10 nH |
| resistors 80, 82 | 3900 ohms |

The LM324 integrated circuit manufactured by National Semiconductor Corp., of Santa Clara, Calif., includes an operational amplifier suitable for use as operational amplifier 68.

It will be appreciated that many modifications to the preferred embodiment are possible that are within the spirit and scope of the invention defined by the claims. For example, while the shared AGC responsive varying element is an operational amplifier in the preferred embodiment of the invention because of its high input impedance, thereby eliminating the need for an AGC buffer amplifier such as an emitter follower as disclosed in said aforesaid Tannery application, other AGC responsive varying elements may be employed. For example, as shown in FIG. 2, a PNP transistor 105 can be used as the varying element. It requires an emitter follower transistor 101, which, in turn, requires a diode 100 to prevent clamping of the AGC voltage, all as explained in said Tannery application. In FIG. 2, elements corresponding to elements in FIG. 1 have been given corresponding numbers.

The following table provides typical values for the additional elements:

| Elements | Value |
| --- | --- |
| 104, 106 | 1k ohms |
| 103 | 50k ohms |
| 107, 108 | 1.8k ohms. |

What is claimed is:

1. Apparatus comprising:
a plurality of RF amplifiers each having an input and an output terminal;
a source of an automatic gain control (AGC) signal; a single varying means having input, output and control terminals, said control terminal being coupled to said source of automatic gain control signal;
a plurality of selection means for selectively coupling said input and output terminals of said single varying means between said output and input terminals of a selected one of said amplifiers for coupling said single varying means in a feedback configuration between the output and the input of said selected amplifier so that the gain of said selected amplifier is varied in accordance with said automatic gain control signal.

2. Apparatus as claimed in claim 1, wherein said amplifiers have different frequency ranges, and said selection means comprises band selection for selecting said RF stages.

3. Apparatus as claimed in claim 1, wherein said RF amplifiers each comprise a bipolar common emitter transistor.

4. Apparatus as claimed in claim 3, wherein said selection means comprises a plurality of diodes respectively coupled to the collectors of said transistors.

5. Apparatus as claimed in claim 3, wherein said varying means comprises an operational amplifier having a first input coupled to said source of AGC signal, a second input coupled to said selection means, and an output coupled to said bases.

6. Apparatus as claimed in claim 5, wherein the emitters of said common emitter configured transistors are directly coupled to a point of RF ground without any intervening elements.

7. Apparatus as claimed in claim 2, wherein a first one of said RF amplifiers has its input coupled to a UHF input and a second one of said RF amplifiers has its input coupled to a VHF input.

8. Apparatus for tuning a receiver to various channels comprising:

a plurality of bipolar common emitter configured transistor RF amplifiers for amplifying RF signals in respective frequency bands;

band selection means for selecting one of said amplifiers depending on the selected channel;

a source of an automatic gain control signal;

a single varying means having input, output, and control terminals, said control terminal being coupled to said source of automatic gain control signal, for varying the bias of said transistors in accordance with said automatic gain control voltage and thereby varying the gain of said amplifiers; and a plurality of selection means responsive to said band selection means for selectively coupling said input and output terminals of said single varying means between the collector and base electrodes of a selected one of said transistor RF amplifiers for coupling said single varying means in a DC feedback configuration between the collector and base electrodes of said selected transistor RF amplifier.

* * * * *